(12) United States Patent
Craft, Jr.

(10) Patent No.: US 7,283,365 B2
(45) Date of Patent: Oct. 16, 2007

(54) JET IMPINGEMENT COOLING APPARATUS AND METHOD

(75) Inventor: Thomas Francis Craft, Jr., Hackettstown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 375 days.

(21) Appl. No.: 11/037,677

(22) Filed: Jan. 18, 2005

(65) Prior Publication Data

US 2006/0158846 A1 Jul. 20, 2006

(51) Int. Cl.
*H05K 7/20* (2006.01)

(52) U.S. Cl. .................. 361/719; 361/691; 361/694; 165/80.3; 165/104.33

(58) Field of Classification Search ............. 361/694, 361/695, 690–691, 719–720; 165/80.3, 104.33; 454/184
See application file for complete search history.

(56) References Cited

U.S. PATENT DOCUMENTS

| | | | | |
|---|---|---|---|---|
| 5,077,601 A * | 12/1991 | Hatada et al. | ............ | 257/722 |
| 5,310,440 A | 5/1994 | Zingher | ............ | 156/345 |
| 5,420,521 A | 5/1995 | Jones | ............ | 324/760 |
| 5,566,377 A * | 10/1996 | Lee | ............ | 361/695 |
| 5,597,035 A * | 1/1997 | Smith et al. | ............ | 165/80.3 |
| 5,761,035 A | 6/1998 | Beise | ............ | 361/699 |
| 5,831,824 A | 11/1998 | McDunn et al. | ............ | 361/699 |
| 5,963,424 A * | 10/1999 | Hileman et al. | ............ | 361/695 |
| 6,113,485 A * | 9/2000 | Marquis et al. | ............ | 454/184 |
| 6,154,368 A * | 11/2000 | Scofield | ............ | 361/719 |
| 6,174,231 B1 * | 1/2001 | Bodin | ............ | 454/184 |
| 6,364,009 B1 * | 4/2002 | MacManus et al. | ............ | 165/185 |
| 6,407,917 B1 | 6/2002 | Craft, Jr. et al. | ............ | 361/690 |
| 6,525,936 B2 * | 2/2003 | Beitelmal et al. | ............ | 361/695 |
| 6,603,658 B2 * | 8/2003 | Manno et al. | ............ | 361/687 |
| 6,678,157 B1 * | 1/2004 | Bestwick | ............ | 361/695 |
| 6,690,577 B2 * | 2/2004 | Chen | ............ | 361/695 |
| 6,719,038 B2 * | 4/2004 | Bird et al. | ............ | 165/80.3 |
| 6,876,549 B2 * | 4/2005 | Beitelmal et al. | ............ | 361/692 |
| 6,987,669 B2 * | 1/2006 | Chen | ............ | 361/695 |
| 7,027,300 B2 * | 4/2006 | Lord | ............ | 361/695 |

(Continued)

FOREIGN PATENT DOCUMENTS

JP 08153985 A * 6/1996

(Continued)

OTHER PUBLICATIONS

Thomas Morel, "Design of Two-Dimensional Wind Tunnel Contractions", *The American Society of Mechanical Engineering, J. Fluid Eng.*, (Dec. 5-10, 1976), pp. 371-378.

(Continued)

*Primary Examiner*—Jayprakash Gandhi
*Assistant Examiner*—Robert J. Hoffberg
(74) *Attorney, Agent, or Firm*—M. I. Finston

(57) ABSTRACT

A nozzle useful for enhancing localized cooling of electronic elements and the like is provided. The nozzle is mountable on a substantially planar face of a substrate. It is conformed to intercept a fluid flowing across said face and redirect it toward the substrate. The nozzle comprises a hood, an output window, and between them, a transition region. The transition region is conformed to turn the flowing fluid toward the substrate and to contract the fluid flow.

13 Claims, 4 Drawing Sheets

U.S. PATENT DOCUMENTS 7,167,363 B1 *   1/2007   Cushman et al. ........... 361/694
2002/0100577 A1 *   8/2002   Wagner ..................... 165/80.3

FOREIGN PATENT DOCUMENTS

JP          2003298268 A  * 10/2003
JP          2005249705 A  *  9/2005

OTHER PUBLICATIONS

Thomas Morel, "Comprehensive Design of Axisymmetric Wind Tunnel Contractions", *The American Society of Mechanical Engineering, J. Fluid Eng.*, (Jun. 1974), pp. 225-233.

David J. Sailor, et al, "Effect of Variable Duty Cycle Flow Pulsations on Heat Transfer Enhancement for an Impinging Air Jet", *Elsevier Science Inc.*, (1999), pp. 574-580.

Mark Summers, et al, "Innovative Thermal Solutions for a High-Density Network Appliance", *Intel Corporation*, (Aug. 2001), pp. 1-7.

S. B. Choi, et al "Air Jet Impingement Cooling of Simulated Multichip Modules in the Electronics", *ASME, Advances in Electronic Packaging*, vol. 4-2, (1993), pp. 679-683.

Nicholas J. Timko, Jr., "Air-Jet Impingement Keeps Computer Cool", *Electronic Packaging & Production*, (May 1987), pp. 33-34.

Jason R. Allen, "Design and Develop of Jet Impingement Experimental Facility", *Union College Student of Mechanical Engineering*, (http://www1.union.edu/), 8 pages.

Jason R. Allen, "Nozzle Profile Design", (http://www1.union.edu/), 4 pages.

\* cited by examiner

JET IMPINGEMENT COOLING APPARATUS AND METHOD

FIELD OF THE INVENTION

This invention relates to structures for diverting flows of coolant fluid to deliver the fluid to local hot spots, and to systems using such structures. More specifically, the invention relates to structures for improving the efficacy of forced air cooling in a circuit stack.

ART BACKGROUND

Electronic circuitry for applications such as signal processing, computing, and telephony often includes circuit boards that are densely populated with heat-generating components. The passive or active removal of excess heat from the environment of such circuit boards is often necessary to assure the proper operation of the circuitry.

Forced convection is a widely used active method of heat removal. In typical applications, circuit boards are stacked in parallel fashion within an enclosure, and fans are used to force air to flow, in a direction parallel to the faces of the boards through the gaps between successive boards.

Such an approach is most useful when the heat sources are uniformly distributed across the face of each circuit board. However, it is becoming increasingly common to design circuit boards in which an isolated hot spot, corresponding for example to a high-speed processor or a high-power component, generates substantially more heat per unit area than is average for the circuit board on which it is mounted.

There remains a need for more effective targeted cooling of such isolated hot spots.

SUMMARY OF THE INVENTION

We have developed a method and apparatus for targeted cooling of individual hot spots mounted on a planar substrate such as a circuit board. Our method can be employed together with the cooling, by forced convection, of a circuit board or a plurality of stacked circuit boards without substantially interfering with the cooling of other boards or of other components on the same board.

In one aspect, our invention involves the use of a shaped nozzle which is conformed to intercept air or another coolant fluid flowing across the face of the substrate and redirect it toward the substrate. The nozzle comprises a hood, a transition region, and an output window. In air, for example, airflow entering the nozzle is first intercepted by the hood, which defines an input cross section for the entering airflow. The airflow is turned through at least 45 degrees in the transition region and concentrated such that it is output through the output window with an output cross section that is no more than the input cross section. In specific embodiments of the invention, the nozzle is conformed to concentrate the airflow, e.g. by a contraction ratio of 2 or more, in substantially the same manner as a straight, i.e., non-turning, nozzle having a polynomial profile. In specific embodiments of the invention, the polynomial profile is bilaterally symmetric.

In a second aspect, our invention involves cooling a heat-generating element by using a nozzle of the kind described above to deflect the flow of a coolant fluid toward the substrate on which the heat-generating element is mounted.

DETAILED DESCRIPTION

Figure 1:
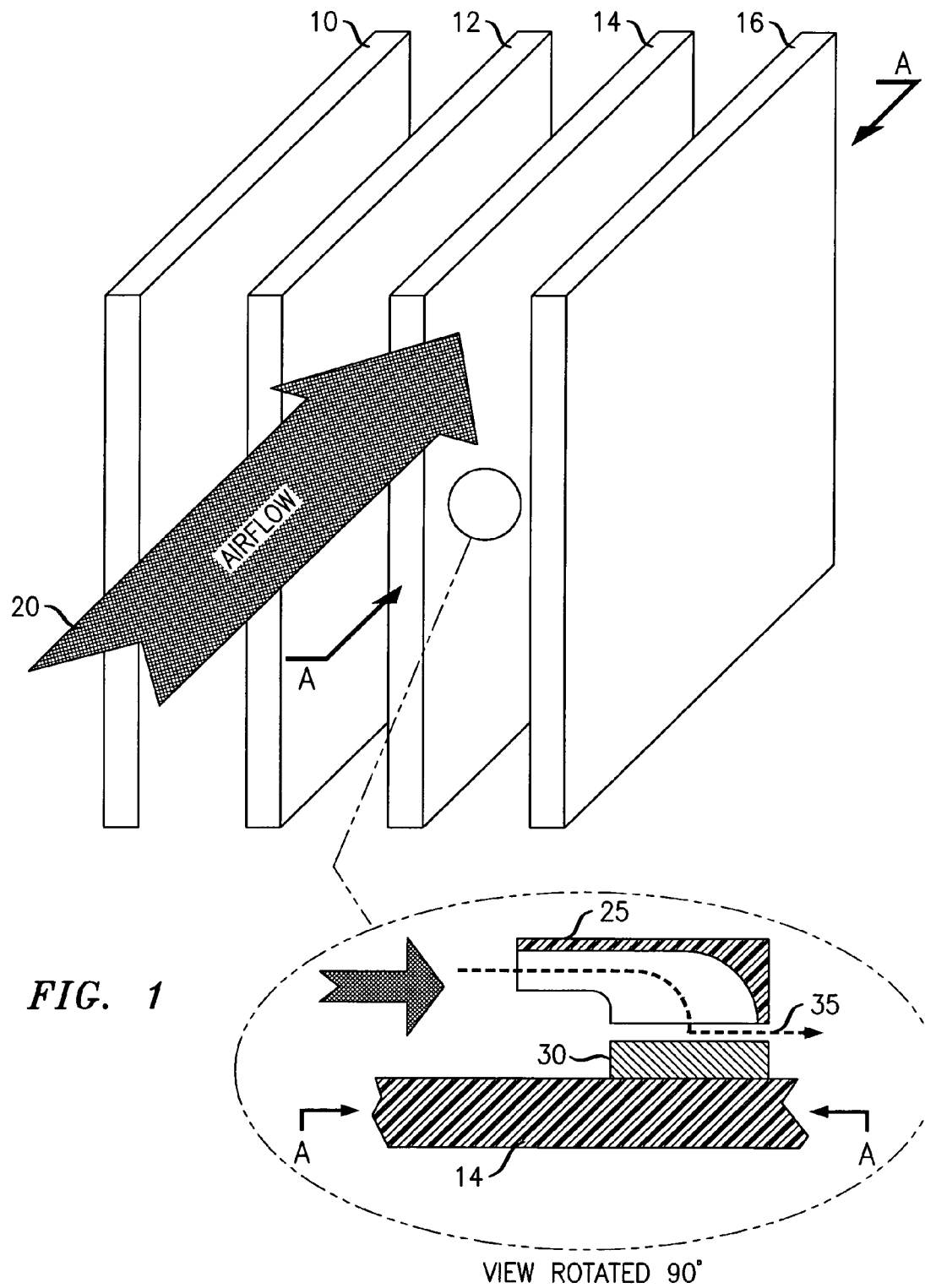
FIG. 1 is a simplified perspective drawing of a stack of circuit boards cooled by forced convection. Included as a detail in FIG. 1 is a simplified elevational view of an individual element on one of the circuit boards together with a cooling nozzle according to the invention in an exemplary embodiment.

Localized cooling is useful, among other places, in stacks of circuit boards 10-16, as shown in FIG. 1. The circuit boards of FIG. 1 are mounted within an enclosure (not shown) and cooled by forced convection with a principal airflow direction as indicated by arrow 20.

It should be noted that although the present invention will find application in air-cooled environments, the scope of the invention is not so limited, because its principles are readily applicable to environments cooled by helium, nitrogen, or other gases, or by water, liquid halocarbons, or other liquids. Moreover, although the nozzle to be described here will often be mounted on a circuit board and used to cool an electronic element, it can readily be mounted on any of various substrates having substantially planar surfaces and used to enhance the cooling of local hot spots of various kinds, including heat sinks.

As shown in the figure, a portion of the airflow, which initially runs parallel to the faces of the circuit boards, is intercepted by nozzle 25 and directed toward substrate 14 in the vicinity of element 30, which is for example an electronic integrated circuit. Arrow 35 is included for illustrative purposes to provide a qualitative representation of the airflow diverted by nozzle 25, but it is not meant to be a realistic or limiting representation thereof.

Figure 2:
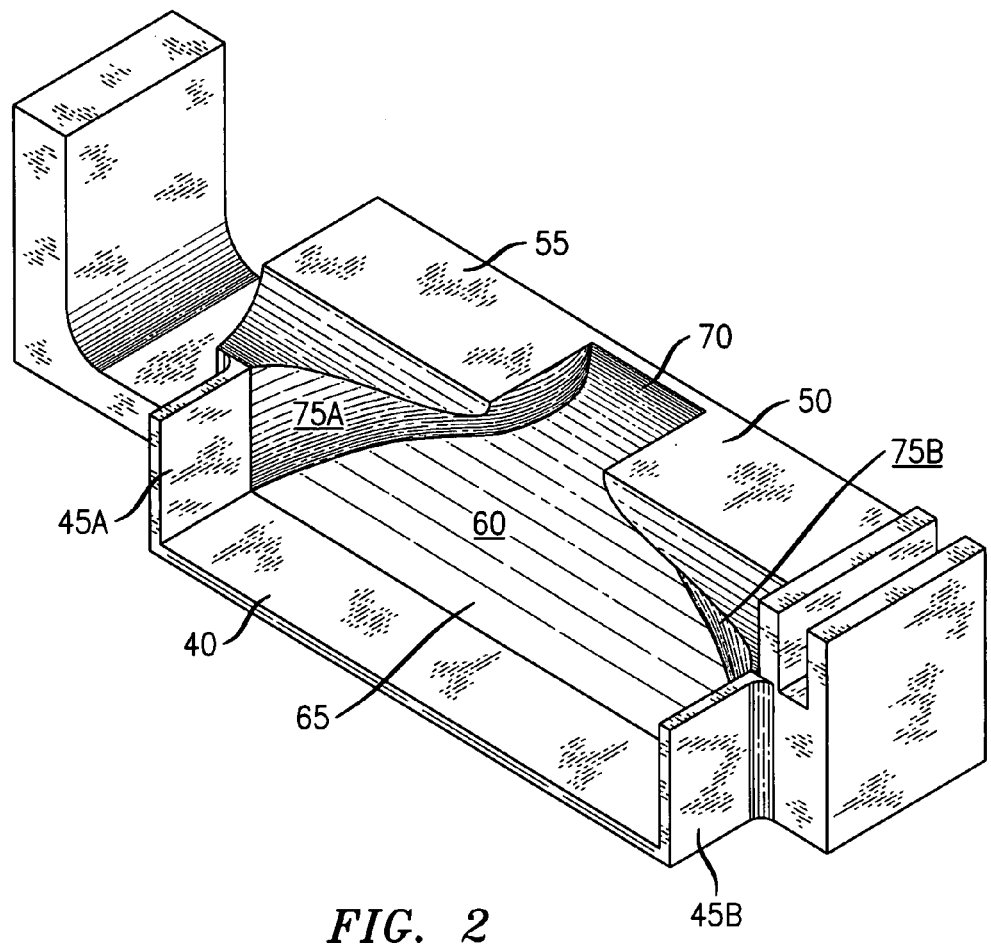
FIG. 2 is a perspective view of a nozzle according to the present invention in an exemplary embodiment. For convenience, the nozzle is shown in an inverted orientation, such that in use, the substrate on which the nozzle is mounted would lie above the nozzle as seen in the figure.

Nozzle 25 is shown in more detail in FIG. 2. As noted, the nozzle is shown in an inverted orientation. Airflow through the circuit enclosure is incident from the left as seen in the figure, and the circuit board or other mounting surface, not shown, lies above the nozzle as seen in the figure. Incident airflow is intercepted by a hood region, which is defined by ceiling 40 and walls 45A and 45B. The ceiling and walls form three sides of a rectangle. The area of the rectangle which is so-defined is referred to here as the "input area." The input area is approximately the cross-sectional area of the airflow portion which is intercepted by the nozzle.

We found that the performance of the nozzle was sensitive to the design of the hood, because the airflow would stall if the depth of the hood, in the input airflow direction, was not set properly. A specific example of a properly dimensioned hood will be provided below.

Airflow which has been intercepted by the hood region is directed through a transition region defined by turning surface 60 and sidewalls 75A and 75B. The transition region turns the airflow before exhausting it through window 50, which is formed as an aperture in floor 55. We have successfully tested a prototype nozzle which turns the airflow through an angle of 90 degrees. However, we believe that even smaller turning angles will be useful for at least some applications. That is, we believe that useful nozzles can be made which turn the airflow toward the substrate by any angle from 45 degrees to 90 degrees.

As an aide to interpretation of the figure, we have designated by reference numeral 65 a portion of turning surface 60 which is substantially parallel to the substrate surface (i.e., in this example the mounting surface of the circuit board), and by reference numeral 70 a portion which is substantially perpendicular to the substrate surface. Between portions 65 and 70, turning surface 60 executes a smooth arc, advantageously a circular arc, of 90 degrees.

As will be seen in the figure, exit window 50 has three sides, which correspond to three sides of a rectangle, which in our experimental prototype is almost square. The area of the rectangle which is so-defined is referred to here as the "output area." The output area is the cross-sectional area of the airflow portion which is exhausted by the nozzle.

In our experimental prototype, the ratio of the input area to the output area, referred to as a "contraction ratio," is about 4. We have found that the increased flow velocity that results when we contract by such a ratio provides an advantageous enhancement of the cooling rate. More generally, we believe that useful performance can be achieved, for at least some applications, with contraction ratios as small as 1:1 and as large as 8:1 or more. At least for air cooling, we believe that contraction ratios as low as 2 will often perform favorably relative to, e.g., heat sinks.

Figure 3:
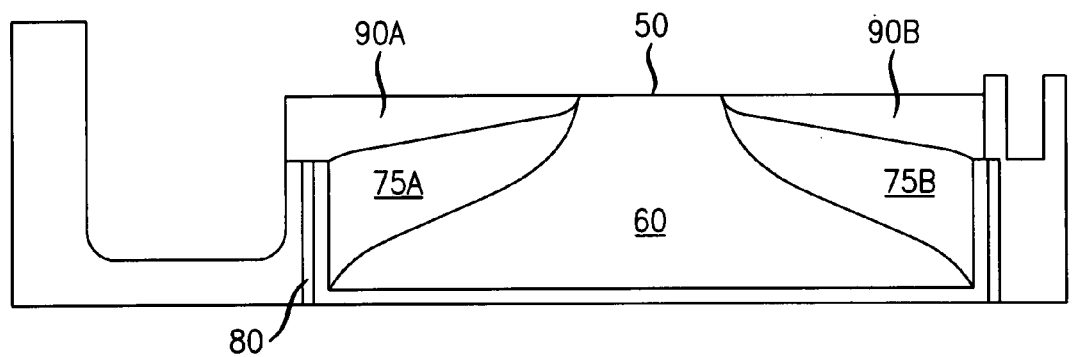
FIG. 3 is an elevational view of a portion of the nozzle of FIG. 2 as seen by an observer looking along the direction of the entering airflow, with the nozzle inverted such that the exit window is facing upward.

Sidewalls 75A and 75B are shown more clearly in FIG. 3. The shape of each sidewall may be thought of as an initially rectangular strip which is bent through 90 degrees and simultaneously twisted through 90 degrees. As a result of such bending and twisting, leading edge 80 of, e.g., sidewall 75A is oriented vertically as seen in the figure, whereas trailing edge projects perpendicularly out of the plane of the figure toward the viewer.

Figure 4:
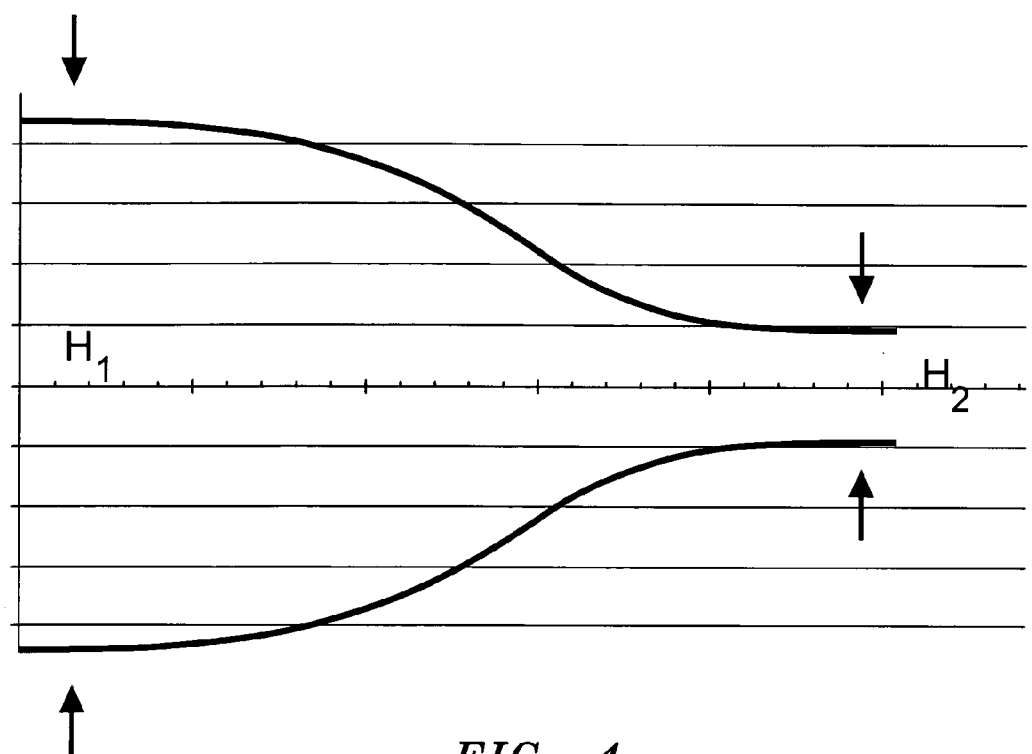
FIG. 4 is a cross section of a nozzle having a cubic profile.

Sidewalls 75A and 75B also converge toward each other in a symmetrical manner to concentrate the airflow while it is being turned. We have found it advantageous to conform sidewalls 75A and 75B according to a bilaterally symmetric, cubic profile. That is, FIG. 4 shows a profile for an example of an equivalent straight, i.e., non-turning, nozzle. The sidewalls of such a nozzle follow, respectively, the upper and lower curves of FIG. 4. Each of these curves is a sigmoid curve defined by a polynomial equation or pair of polynomial equations. As is known in the art of wind-tunnel design, such polynomials are advantageously of at least third degree. It is advantageous for the width of the channel defined between sidewalls 75A and 75B to have a similar profile, the necessary changes being made to account for the turning of the channel. Accordingly, a transition region is herein considered to be equivalent to a channel having a bilaterally symmetric, polynomial profile if, in addition to turning through 90 degrees or some other turning angle, the channel sidewalls follow a symmetric pair of sigmoid curves that deviate by no more than 10% from polynomial curves.

Turning back to FIG. 3, also visible in the figure are chamfers 90A and 90B. The chamfers are undercuts in the body of the nozzle conformed to facilitate airflow, beneath the nozzle, in the direction parallel to the substrate surface. Appropriate shapes for the chamfered surfaces will be known to those of skill in the art and need not be described here in detail.

Figure 5:
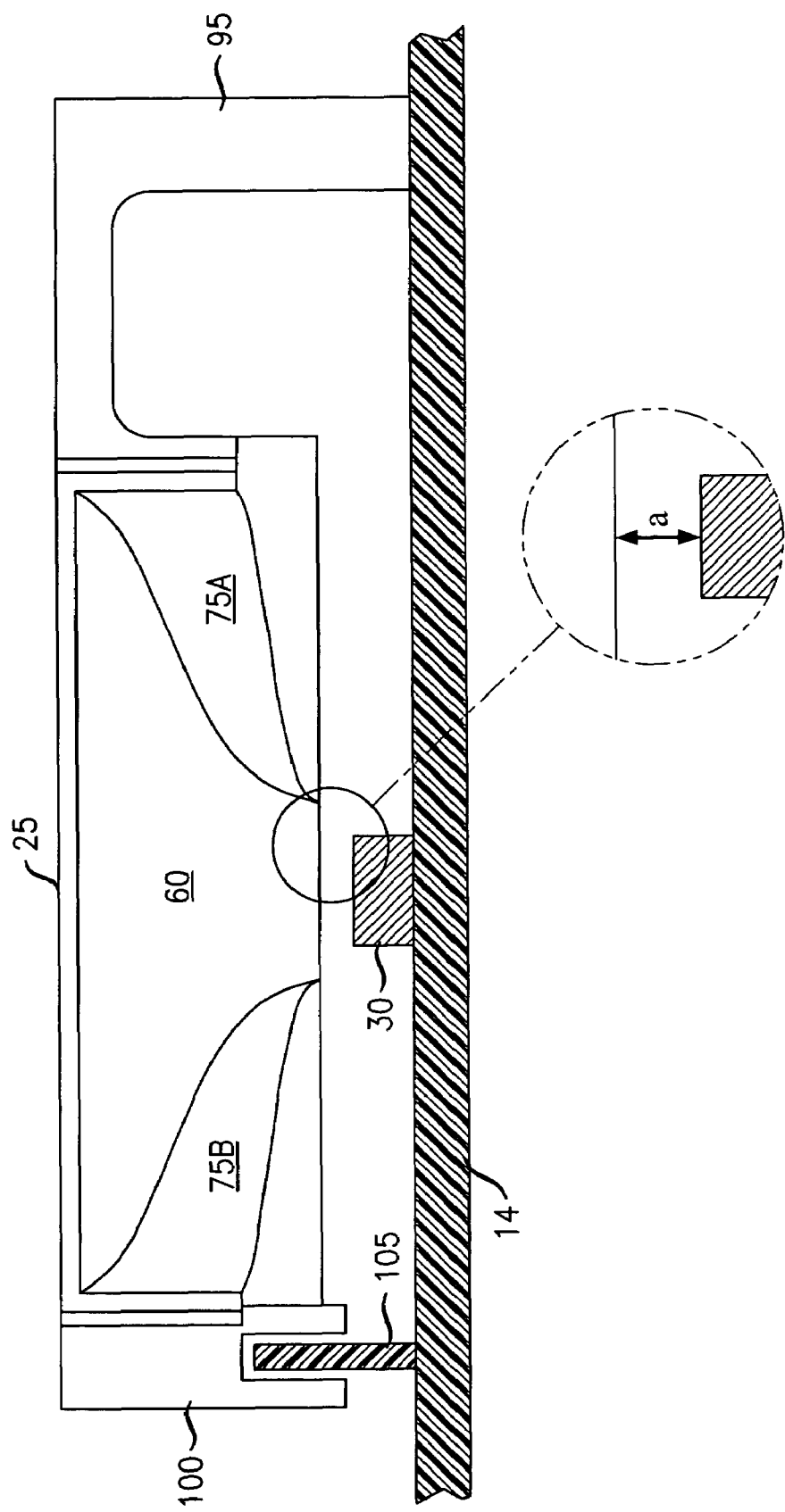
FIG. 5 is an elevational view of the nozzle of FIG. 2 mounted on a circuit board, as seen by an observer looking along the direction of the entering airflow. The exit window is facing downward as seen in the figure, and the circuit board is visible at the bottom of the figure.

Turning now to FIG. 5, shown there is a view of nozzle 25 mounted on circuit board 14. (Like reference numerals are used to indicate features shown in previous figures.) In the embodiment depicted, projections 95 and 100, integral with the body of the nozzle, are used to facilitate mounting on the circuit board. Projection 100 engages mounting guide, rail, or clip 105 which projects upward from the circuit board. Projection 95 mounts directly on the circuit board. It will be understood from the figure that the mounting is carried out so as to leave a vertical standoff distance α between the upper surface of the element 30 which is to be cooled, and the bottom of the nozzle. We have found that cooling is facilitated by a standoff distance which permits some air to flow, parallel to the substrate surface, between the nozzle and the cooled element. The precise standoff distance that is optimal will depend on the height of element 30, the airflow velocity, and the rate of heat generation by element 30. A specific example of a standoff distance that we found useful will be provided below.

In empirical tests, we determined that it was most advantageous to position the back edge of the output window at the trailing edge of the element to be cooled. In general, however, the precise position that is most advantageous may depend on various factors such as the dimensions of the hot element, the airflow velocity, and the rate of heat generation by the element.

EXAMPLE

Our prototype nozzle was designed for a nominal airflow velocity of about 2 meters per second. The input window was 4.4 cm wide in the direction parallel to the substrate, and 0.9 cm high in the direction perpendicular to the substrate. The output window was 1.0 cm wide in the direction transverse to the input airflow, and 0.9 cm long in the direction parallel to the input airflow. Accordingly, the contraction ratio, or the ratio of input to output areas, was 4.4.

The depth of the hood, i.e. as measured parallel to the input airflow direction, was 0.85 cm.

The standoff distance α was 2 mm, and the upper surface of the hot element stood 3.5 mm above the circuit board.

The length of the transition region, as measured in the direction of the input airflow (i.e., parallel to the circuit board) from the trailing end of the hood to the trailing end of the output window, was 1.3 cm.

The nozzle was designed according to the well-known rules for contraction nozzles published in T. Morel, "Design of Two-Dimensional Wind Tunnel Contractions," *J. Fluids Eng.* 99, vol. 2, 371-378 (1977). The nozzle profile had the equations:

$$\frac{H - H_2}{H_1 - H_2} = 1 - \frac{x^3}{X^2 L^3}, \frac{x}{L} \leq X;$$

$$\frac{H - H_2}{H_1 - H_2} = \frac{\left(1 - \frac{x}{L}\right)^3}{(1 - X)^2}, \frac{x}{L} > X.$$

In the preceding equations, H represents width of the nozzle (the height is assumed constant), and x represents axial position. The parameters $H_1$ and $H_2$ are respectively, the pertinent dimensions of the input and output windows, and L is the length of the nozzle. The parameter X is the location of a pressure minimum in the nozzle, normalized to the length of the nozzle. It is the match point between the two curves specified in the above pair of equations. In our design, the parameters had the following values:

| | | | |
|---|---|---|---|
| $H_1$ = 4.445 cm | $H_2$ = 0.9525 cm | X = 0.610174 | L = 6.136358 cm |

It should be noted that our exemplary embodiment of the invention using cubic contraction-nozzle profiles is not meant to be limiting. Instead, we believe that other profiles effective for contraction nozzles, including profiles based on even higher-order polynomials, will also be effective in the present context and thus fall within the scope and spirit of the present invention.

Figure 6:
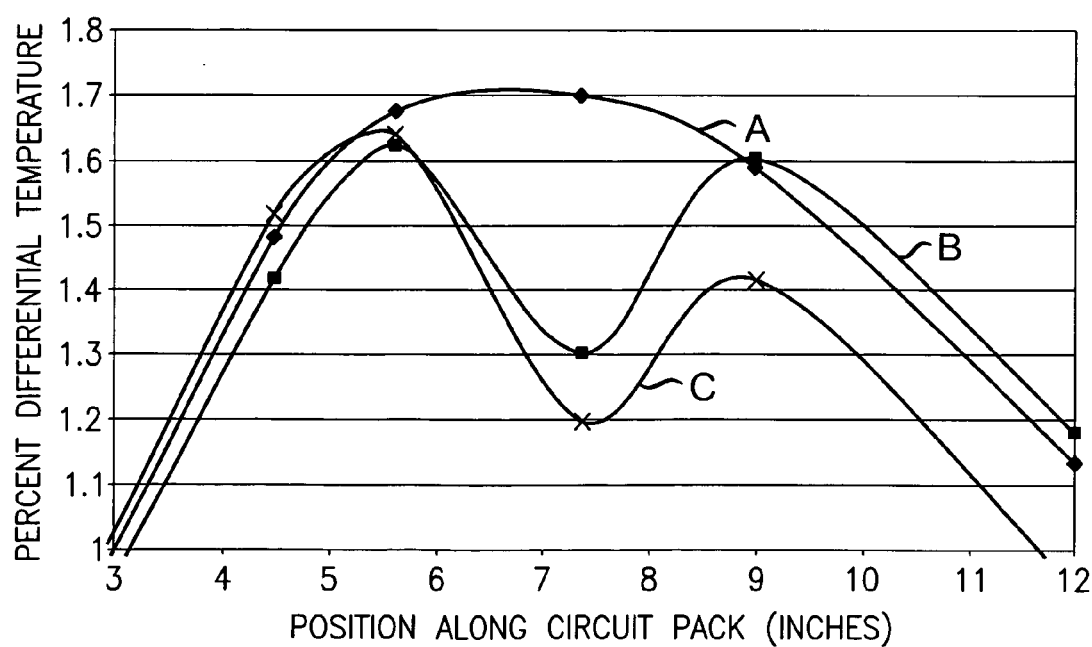
FIG. 6 shows experimental results obtained using a nozzle as described here to cool a hot spot on a circuit board. Plotted in the figure is the difference between local and ambient temperature, expressed as a percentage of ambient temperature.

FIG. 6 shows experimental results obtained using a nozzle of the kind described above to cool a hot spot on a circuit board. Plotted in the figure is the difference between local and ambient temperature, expressed as a percentage of ambient temperature. This so-called "percent differential temperature" is plotted versus position along a circuit pack in the downwind direction. Curve A represents temperature deviations near the hot spot when no means for enhancing the cooling of the circuit pack are employed. Curve B represents the results when a heat sink is used at the hot spot. Curve C represents the results when a nozzle according to the present invention is used. It will be understood from the figure that the nozzle outperforms the heat sink not only at the hot spot, but also at locations downstream of the hot spot, where the heat sink offers no improvement.

The invention claimed is:

1. Apparatus comprising a nozzle which is mountable on a substantially planar face of a substrate and conformed to intercept a fluid flowing across said face and to redirect the intercepted fluid toward the substrate, wherein:
    the nozzle comprises a hood, an output window, and a transition region connecting the hood to the output window;
    the hood is arranged to intercept a portion of a flowing fluid as said portion first enters the nozzle, and has an input cross section for entering fluid flow; and
    the transition region is conformed to turn the intercepted flowing fluid through a turning angle of at least 45 degrees but not more than 90 degrees and output said fluid through the output window with a contraction ratio of at least 1.

2. The apparatus of claim 1, wherein the transition region is conformed to contract the fluid flow in the manner of a contraction nozzle having a polynomial profile.

3. The apparatus of claim 2, wherein said profile is bilaterally symmetric.

4. The apparatus of claim 3, wherein the transition region comprises a pair of sidewalls that turn through said turning angle and also converge together according to said profile.

5. The apparatus of claim 4, wherein the profile is cubic.

6. The apparatus of claim 2, wherein the transition region is conformed to provide a contraction ratio of at least 2.

7. The apparatus of claim 2, wherein the transition region is conformed to provide a contraction ratio of at least 4.

8. The apparatus of claim 1, in which the substrate is a printed circuit board on which the nozzle is mounted, and the apparatus further comprises said printed circuit board and at least one electronic component mounted on the printed circuit board in a receiving location with respect to flowing fluid that in use is redirected by the nozzle.

9. The apparatus of claim 8, in which the fluid is air and the apparatus further comprises an enclosure in which the printed circuit board is mounted and at least one fan for producing a flow of air across at least one face of the printed circuit board.

10. A method for cooling a heat-generating element mounted on a substantially planar face of a substrate, comprising:
    intercepting a portion of a flow of fluid moving across said face;
    redirecting the intercepted flow toward said face through a turning angle of at least 45 degrees but not more than 90 degrees;
    contracting the intercepted flow between a convergent pair of sidewalls so as to increase the velocity thereof; and
    impinging at least some of the redirected flow onto said element.

11. The method of claim 10, wherein the redirecting and contracting are carried out by directing the flow between a pair of sidewalls that turn through said turning angle and also converge together according to a contraction nozzle profile that is polynomial and bilaterally symmetric.

12. The method of claim 10, wherein the contracting is carried out so as to produce a contraction ratio of at least 2.

13. The method of claim 10, wherein the contracting is carried out so as to produce a contraction ratio of at least 4.

* * * * *